United States Patent
Lin (10) Patent No.: US 10,288,356 B2
(45) Date of Patent: May 14, 2019

(54) VAPOR CHAMBER AND HEAT PIPE COMBINED STRUCTURE AND COMBINING METHOD THEREOF

(71) Applicant: TAIWAN MICROLOOPS CORP., New Taipei (TW)

(72) Inventor: Chun-Hung Lin, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 54 days.

(21) Appl. No.: 15/294,650

(22) Filed: Oct. 14, 2016

(65) Prior Publication Data

US 2018/0106552 A1    Apr. 19, 2018

(51) Int. Cl.
| | | |
|---|---|---|
| F28D 15/00 | (2006.01) | |
| B23P 6/00 | (2006.01) | |
| F28D 15/02 | (2006.01) | |
| F28D 15/04 | (2006.01) | |
| H01L 23/427 | (2006.01) | |
| H05K 7/20 | (2006.01) | |

(52) U.S. Cl.
CPC ..... *F28D 15/0275* (2013.01); *F28D 15/0266* (2013.01); *F28D 15/04* (2013.01); *H01L 23/427* (2013.01); *H05K 7/20336* (2013.01); *F28F 2275/06* (2013.01)

(58) Field of Classification Search
CPC .... F28D 15/0275; F28D 15/04; F28D 15/046; F28D 15/0266
USPC ...... 29/890.032; 165/104.33, 104.27, 104.26
See application file for complete search history.

(56) References Cited

U.S. PATENT DOCUMENTS 4,917,177 A *   4/1990  Gernert ............... F28D 15/0233
                                                            122/366
2005/0178532 A1   8/2005  Meng-Cheng et al.
2017/0292793 A1 * 10/2017  Sun ..................... F28D 15/0233

FOREIGN PATENT DOCUMENTS

| CN | 201093903 | 7/2008 |
|---|---|---|
| CN | 201731784 U | 2/2011 |
| CN | 203934263 U | 11/2014 |
| CN | 205980889 U | 2/2017 |
| JP | 2016072604 A | 5/2016 |
| KR | 100598516 | 7/2006 |

(Continued)

OTHER PUBLICATIONS

Office Action dated Mar. 13, 2017 of the corresponding Taiwan patent application.

(Continued)

*Primary Examiner* — Paul Alvare
(74) *Attorney, Agent, or Firm* — Chun-Ming Shih; HDLS IPR Services (57) ABSTRACT

A vapor chamber and heat pipe combined structure and method; the vapor chamber and heat pipe combined structure includes a heat pipe, a vapor chamber and a working fluid. The heat pipe includes a pipe body, a fixing section, and a first capillary tissue. The vapor chamber includes an upper metal casing, a lower metal casing, a containing chamber and a second capillary tissue installed in the containing chamber. The working fluid is filled into the containing chamber, and the fixing section of the heat pipe is coupled to the upper metal casing, so that the first capillary tissue is coupled to the second capillary tissue. The combined structure facilitates the connection and fixation of the heat pipe and improves the reflux speed of the liquid-state working fluid.

9 Claims, 9 Drawing Sheets

(56) References Cited

FOREIGN PATENT DOCUMENTS

| KR | 100598516 B1 | 7/2006 |
| TW | 200936977 A | 9/2009 |
| TW | M517315 U | 2/2016 |
| TW | M522331 U | 5/2016 |
| TW | M534370 U | 12/2016 |

OTHER PUBLICATIONS

Office Action dated Jan. 3, 2019 of the corresponding China Patent Application.

* cited by examiner

VAPOR CHAMBER AND HEAT PIPE COMBINED STRUCTURE AND COMBINING METHOD THEREOF

FIELD OF THE INVENTION

The technical field generally relates to a thermal conduction technology, more particularly, to a vapor chamber and heat pipe combined structure and a combining method thereof.

BACKGROUND OF THE INVENTION

As the computing speed of electronic devices increases, the heat generated by the electronic devices becomes increasingly higher. To overcome the issue of generating a large quantity of heat, manufacturers have introduced and used a heat pipe and a vapor chamber with good thermal conductivity for dissipating heat. Although a gas-state working fluid in the heat pipe flows in the same direction, the heat conducted by the working fluid is very limited due to the limitation of its volume. On the other hand, the vapor chamber has a relatively large heated surface for attaching a heat source and conducting heat directly, but the flowing direction of the gas-state working fluid is disordered, and the heat conduction and dissipation performance of the vapor chamber is limited.

To overcome these problems, related manufactures integrate the heat pipe and the vapor chamber to form a combined structure, wherein the heat pipe is passed and connected to an edge of the vapor chamber, and the internal space of the heat pipe and the internal space of the vapor chamber are communicated with each other.

Although the conventional vapor chamber and heat pipe combined structure provides the effects of heat conduction and dissipation, the following problems still exist. The capillary tissue in the heat pipe is not attached to the capillary tissue in the vapor chamber, and thus the liquid-state working fluid may be interrupted or discontinuous in the reflux process, and the heat conduction and dissipation performance is lowered significantly. In addition, the vapor chamber usually has a thin wall, so that a rim is generally required and formed on the wall of the vapor chamber for providing a support to the heat pipe and keeping the heat pipe on the vapor chamber securely, and such conventional structure incurs a more complicated manufacturing process and a higher manufacturing cost and obviously requires improvements.

SUMMARY OF THE INVENTION

It is a primary objective of this disclosure to provide a vapor chamber and heat pipe combined structure and a combining method thereof that facilitate the connection and fixation of the heat pipe and improve the reflux speed of the liquid-state working fluid.

To achieve the aforementioned and other objectives, this disclosure provides a vapor chamber and heat pipe combined structure, comprising a heat pipe, a vapor chamber and a working fluid. The heat pipe comprises a pipe body, a fixing section extended from an end of the pipe body, and a first capillary tissue installed in the pipe body. The vapor chamber comprises an upper metal casing, a lower metal casing engaged closely with the respective upper metal casing, a containing chamber formed between the upper metal casing and the lower metal casing, a second capillary tissue installed in the containing chamber, a riser disposed at the lower metal casing, and a passing-in portion communicated with the containing chamber, wherein the heat pipe is passed and coupled to the passing-in portion, and the fixing section is coupled to the upper metal casing, so that the first capillary tissue and the second capillary tissue are coupled to each other. The working fluid is filled into the containing chamber.

To achieve the aforementioned and other objectives, this disclosure further provides a vapor chamber and heat pipe combining method, comprising the steps of: a) providing a pipe body having a fixing section formed and extended from an end of the pipe body, wherein the pipe body has a first capillary tissue installed therein; b) coupling the pipe body having the fixing section to the inner wall of an upper metal casing, coating a metal powder onto the inner wall of the upper metal casing, sintering the metal powder to form a second capillary tissue, and coupling the first capillary tissue; c) engaging the upper metal casing closely with a corresponsive lower metal casing, forming a containing chamber between the upper metal casing and the lower metal casing, and forming at least one riser at the lower metal casing for passing and connecting and connecting a passing-in portion to the pipe body; and d) filling a working fluid into the containing chamber, and removing air in the containing chamber before sealing the containing chamber.

This disclosure has the following effects. The first capillary tissue and the second capillary tissue are attached to each other to improve the reflux speed of the working fluid. The fixing section of a different structure is attached closely to the corresponsive attaching portion of the upper metal casing, not just attaching the first capillary tissue to the second capillary tissue easily only, but also returning the liquid-state working fluid into the containing chamber of the vapor chamber quickly to improve the thermal conduction performance of the of this disclosure quickly. In addition, the upper metal casing of this disclosure is capable of fitting a fixing section with a structural change and being configured into a corresponsive attaching portion and then welded, sealed, and attached to achieve the effects of conducting heat and fixing the heat pipe.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
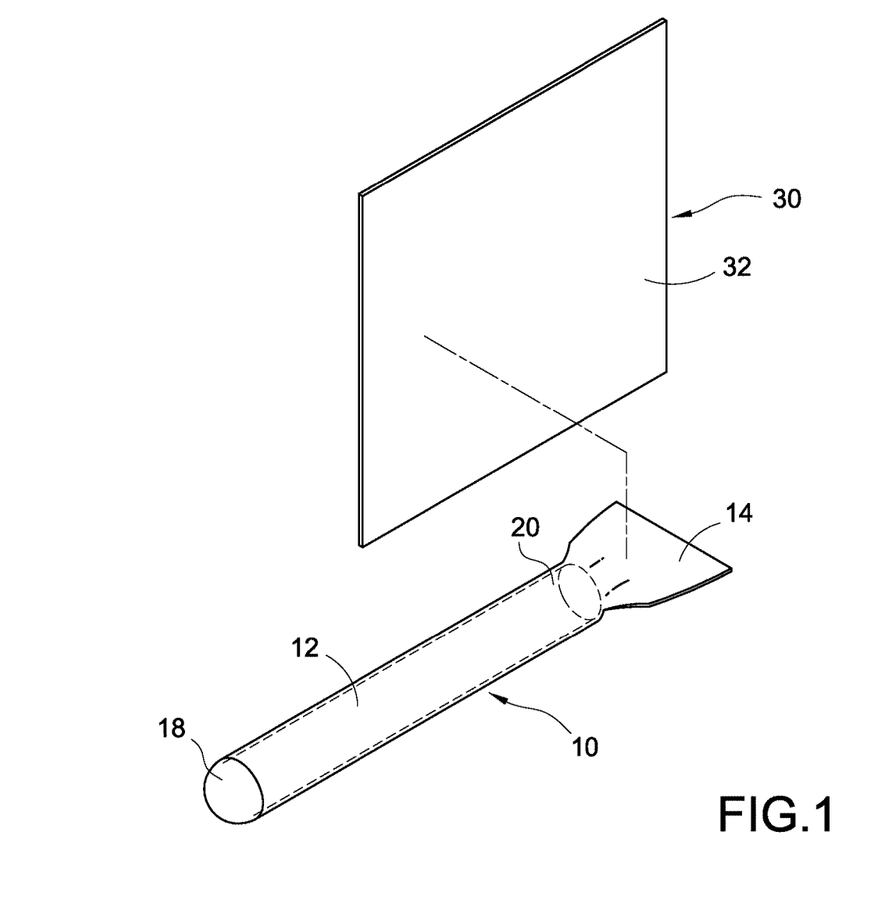
FIG. 1 is an exploded view of a preferred embodiment of this disclosure.
Figure 2:
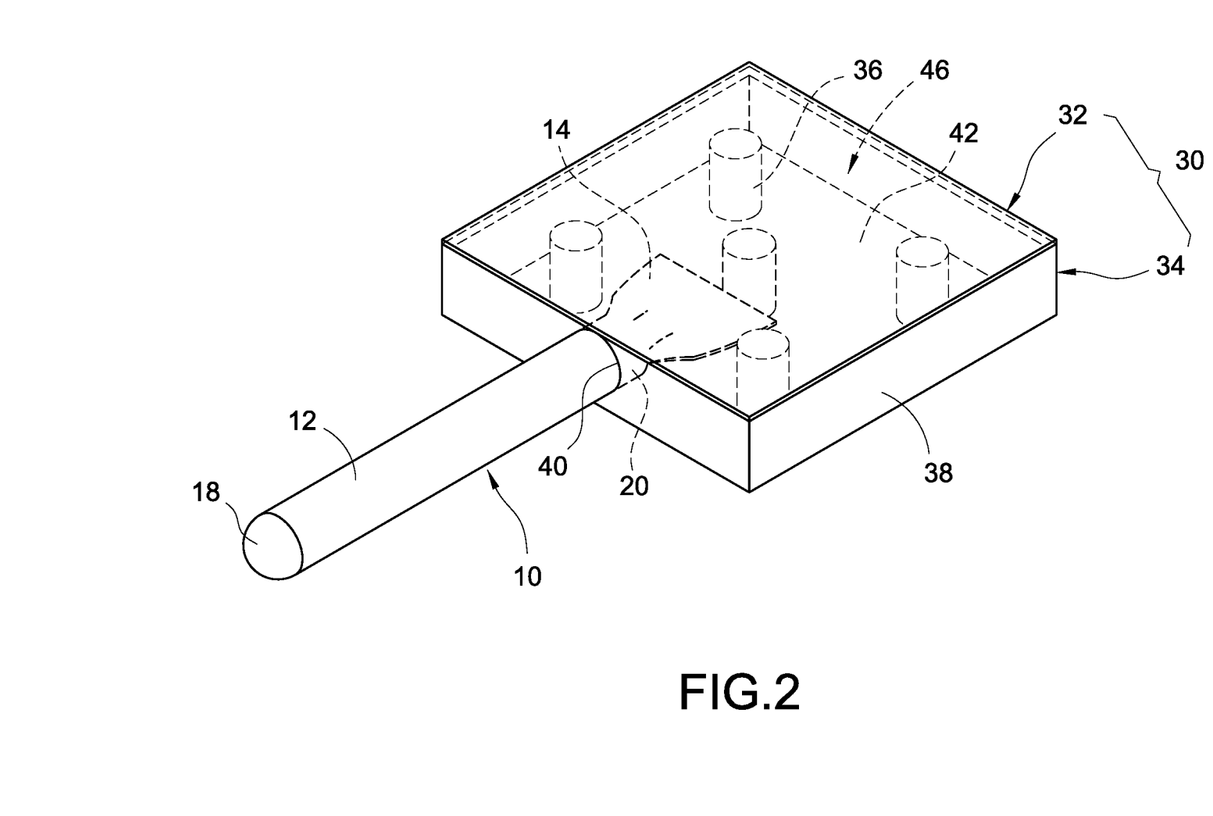
FIG. 2 is a perspective view of the first preferred embodiment of this disclosure.
Figure 3:
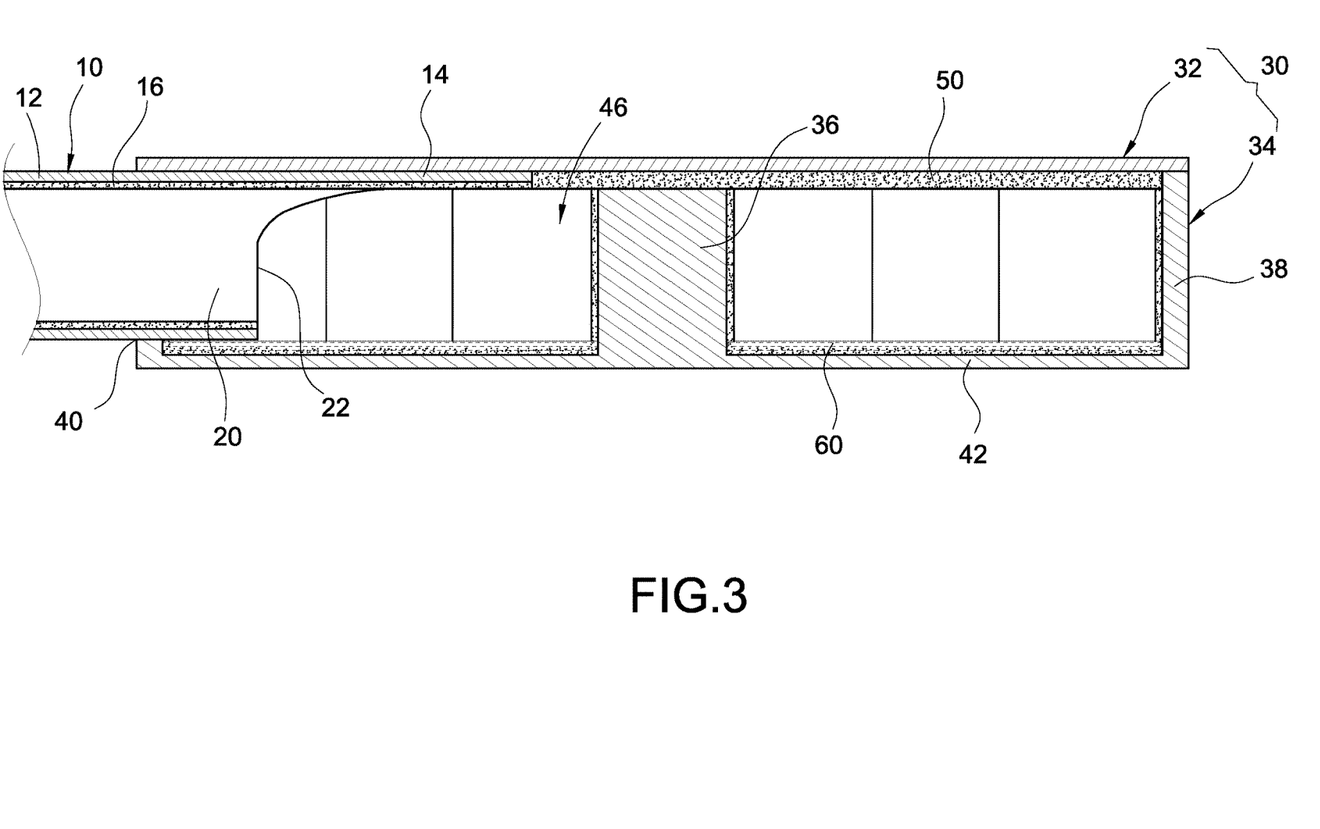
FIG. 3 is a cross-sectional view of the first preferred embodiment of this disclosure.
Figure 4:
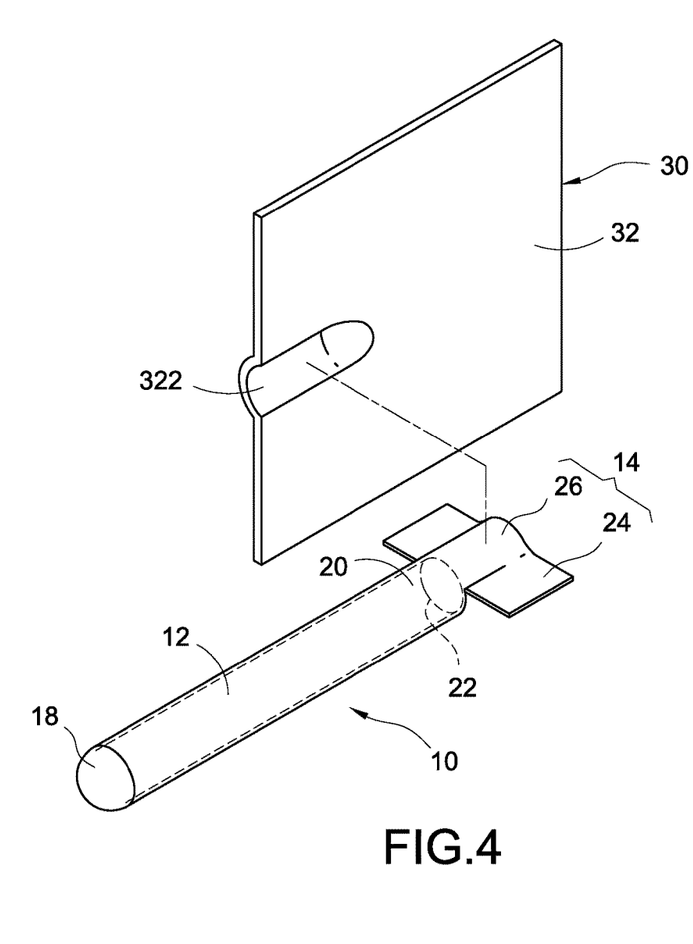
FIG. 4 is an exploded view of a second preferred embodiment of this disclosure.
Figure 5:
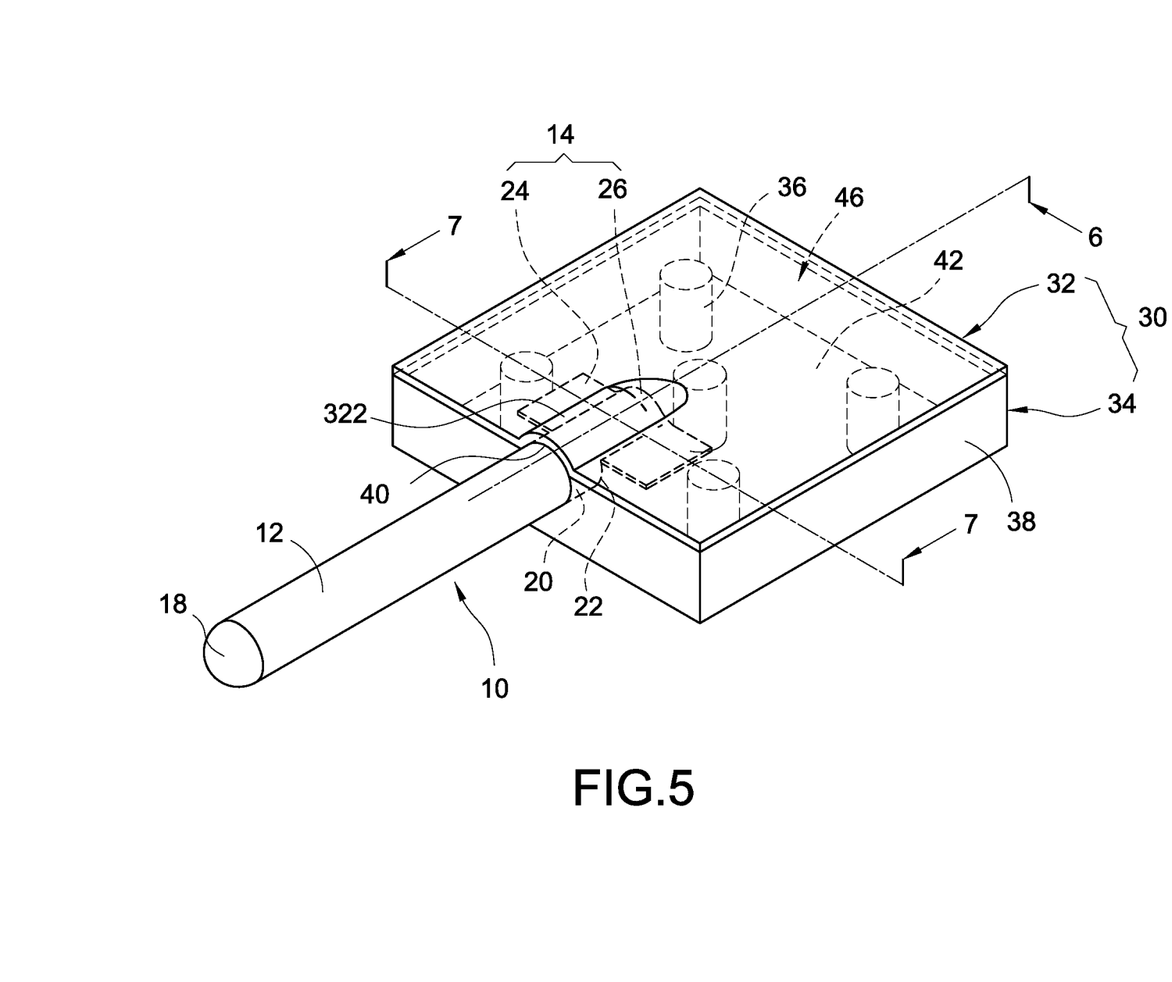
FIG. 5 is a perspective view of the second preferred embodiment of this disclosure.
Figure 6:
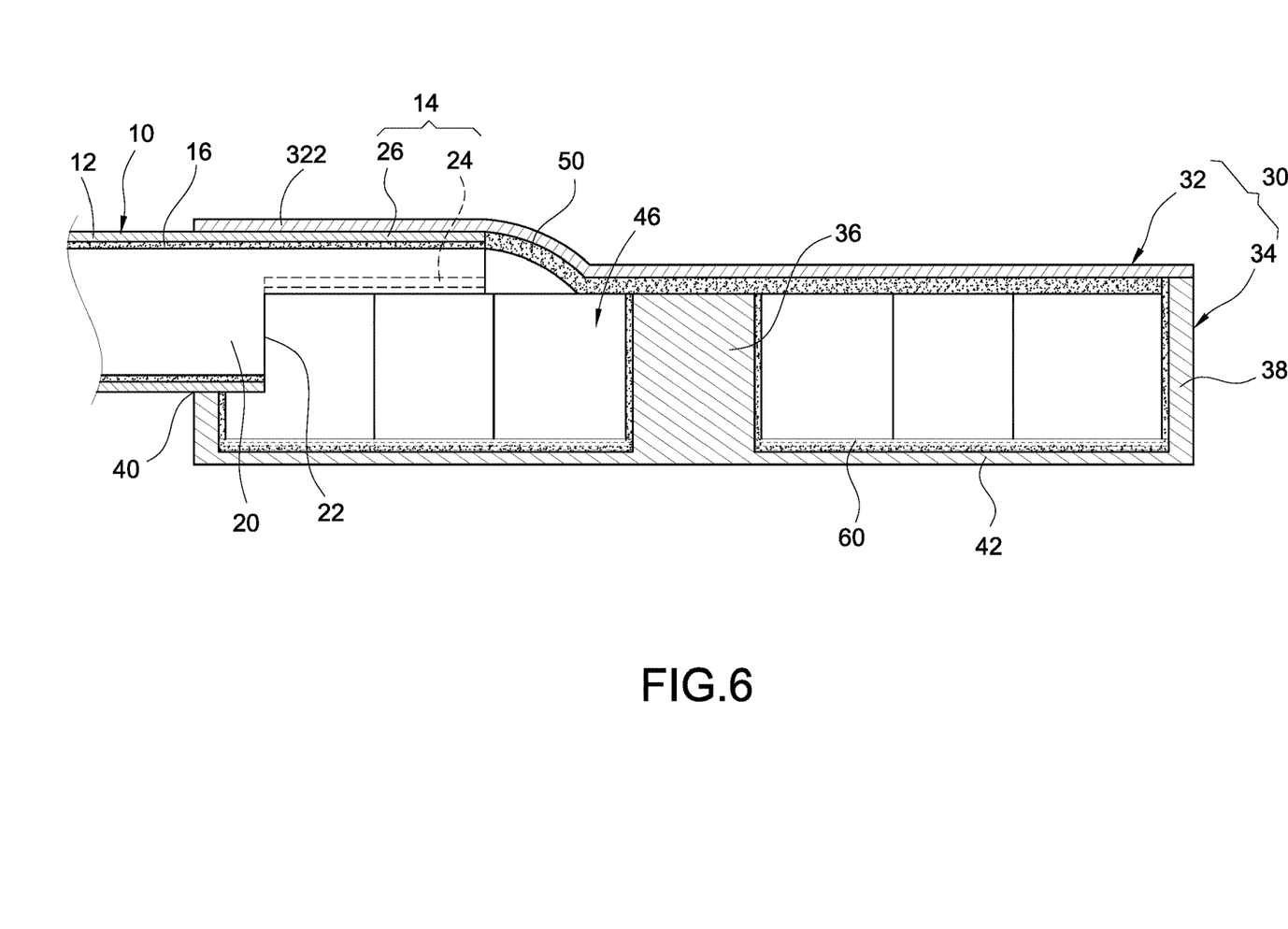
FIG. 6 is a cross-sectional view of the second preferred embodiment of the present invention.
Figure 7:
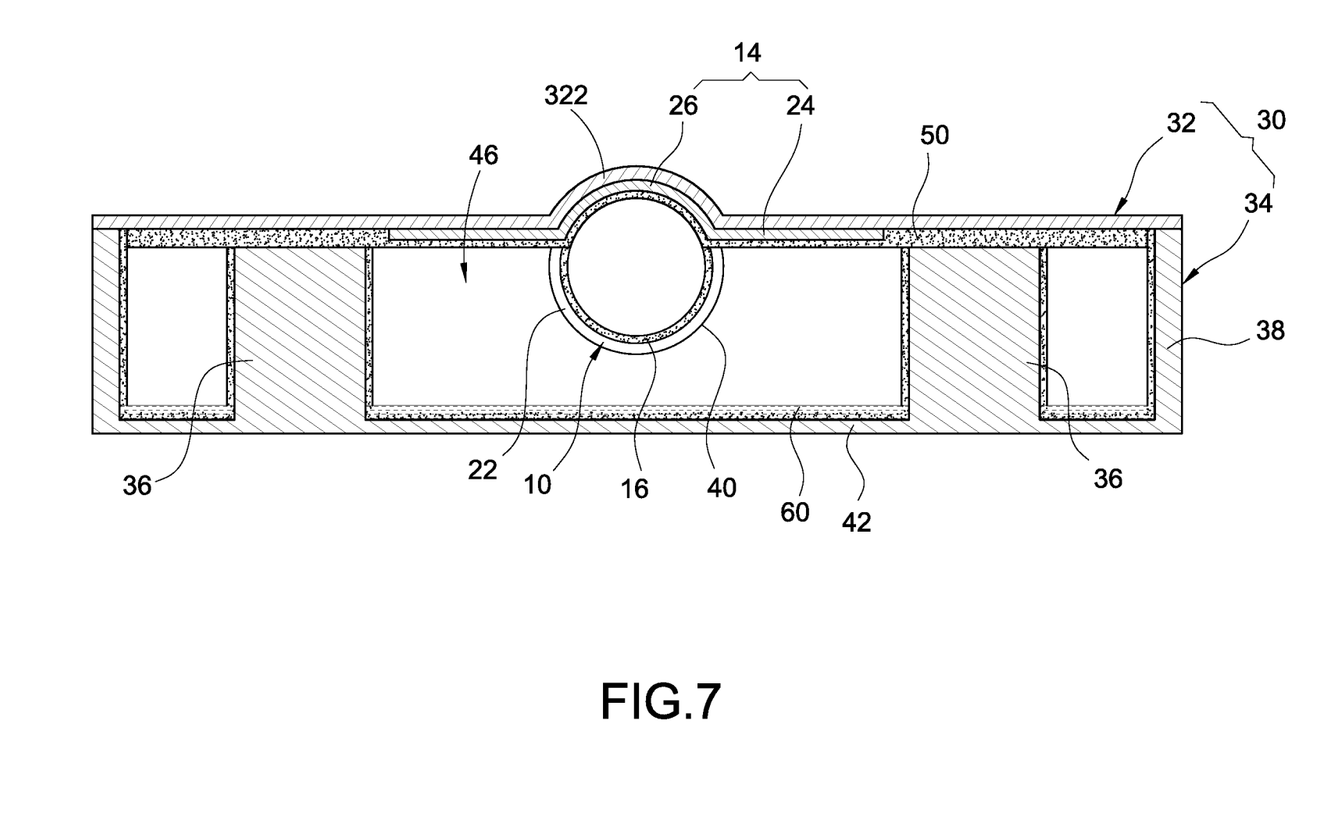
FIG. 7 is another cross-sectional view of the second preferred embodiment of the present invention.
Figure 8:
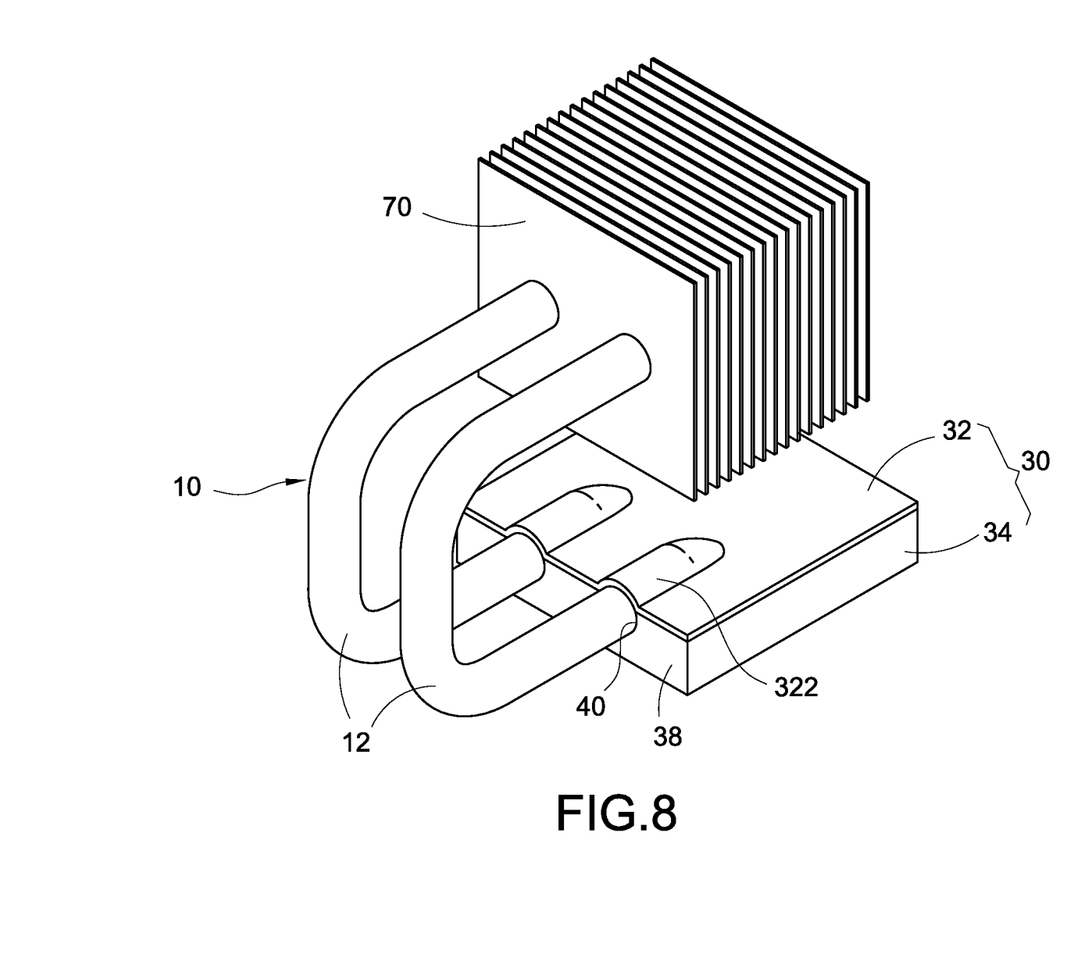
FIG. 8 is a schematic view of an application of the second preferred embodiment of the present invention.

With reference to FIGS. 1 to 3 for a vapor chamber and heat pipe combined structure of this disclosure, the vapor chamber and heat pipe combined structure comprises a heat pipe 10, a vapor chamber 30 and a working fluid 60. The vapor chamber and heat pipe combined structure can be applied to the heat dissipation for computer hosts, servers, or industrial host systems, etc.

The heat pipe 10 comprises a pipe body 12, a fixing section 14 extended from an end of the pipe body 12, and a first capillary tissue 16 installed in the pipe body 12 and along the fixing section 14. The pipe body 10 is made of a material such as copper, aluminum, or other appropriate alloys with good thermal conductivity, and the pipe body 10 has a closed end 18 and an open end 20, and the fixing section 14 is formed and extended from the open end 20 to the outside of the pipe body 12.

The pipe body 12 further has a cut edge 22 cut by a knife or cutter, and a side of the cut edge 22 is extended and coupled to the fixing section 14, so that the fixing section 14 is in the shape of a flat plate. In FIG. 3, an end of the cut edge 22 is perpendicular to the pipe body 12, and the other end is slantingly coupled to the fixing section 14 to facilitate forming the fixing section 14 into the shape of a flat plate. The first capillary tissue 16 is made of a metal mesh, a fiber bundle, a metal powder sinter, or any other appropriate material. The first capillary tissue 16 is installed on an inner wall of the pipe body 12 and along an inner wall of the fixing section 14.

The vapor chamber 30 comprises an upper metal casing 32, a lower metal casing 34 engaged with the corresponsive upper metal casing 32, and a plurality of support bodies 36. A containing chamber 46 is formed between the upper metal casing 32 and the lower metal casing 34, and a second capillary tissue 50 is installed in the containing chamber 46. The upper metal casing 32 has an attaching portion 322, and the lower metal casing 34 has a plurality of risers 38 such as four risers 38, so that the vapor chamber 30 becomes a rectangular casing, and at least one riser 38 has a passing-in portion 40 communicated with the containing chamber 46. The upper metal casing 32, the lower metal casing 34, and the plurality of support bodies 36 are made of a thermally conductive material such as copper, aluminum or their alloys. The second capillary tissue 50 is made of a material such as a metal mesh, a fiber bundle, a metal powder sinter, or any other appropriate material.

Each support body 36 is erected and installed between the upper metal casing 32 and the lower metal casing 34, and an end of the support body 36 is attached closely with the second capillary tissue 50 to prevent the vapor chamber 30 from being deformed at room temperature of high temperature. Each support body 36 is preferably erected and extended from a base plate 42 of the lower metal casing 34 to the second capillary tissue 50 of the upper metal casing 32, and a second capillary tissue 50 is disposed on a surface of each support body 36. The shape of each support body 36 includes but not limited to a circular cylindrical shape, a triangular shape, an elliptical shape, or any other appropriate shape.

In the first preferred embodiment, the fixing section 14 is formed and extended directly from both sides of the cut edge 22 and configured to be parallel to the attaching portion 322. In other words, the fixing section 14 is in the shape of a flat plate, and the attaching portion 322 is a plane, so that the fixing section 14 is attached closely to the attaching portion 322, and the open end 20 of the heat pipe 10 is passed and coupled to a passing-in portion 40 of the riser 38, and the fixing section 14 is attached closely to the attaching portion 322 by welding and fixed into the vapor chamber 30.

In this preferred embodiment, the passing-in portion 40 is preferably a through slot. In other embodiments, the passing-in portion 40 may be a through hole or a hole jointly formed on the upper/lower metal casings 32, 34. In addition, this preferred embodiment further comprises third capillary tissue (not shown in the figure) coupled to the first capillary tissue 16 and the second capillary tissue 50.

With reference to FIGS. 4 to 8 for the second preferred embodiment of this disclosure, the difference between this preferred embodiment and the previous preferred embodiment resides on that the fixing section 14 of this preferred embodiment has a flap 24 extended separately from both sides of the cut edge 22, and an arc pipe portion 26 disposed between the two flaps 24, and the attaching portion 322 of the upper metal casing 32 is an arc groove 322 closely attached to the arc pipe portion 26.

The working fluid 60 is filled into the containing chamber 46, wherein the heat pipe 10 is passed and coupled to the passing-in portion 40, and the fixing section 14 is coupled to the attaching portion 322, so that the first capillary tissue 16 and the second capillary tissue 50 are coupled to each other. Therefore, the returned liquid-state working fluid 60 can flow from the first capillary tissue 16 to the second capillary tissue 50 to improve the reflux speed of the liquid-state working fluid 60.

In this preferred embodiment, the working fluid 60 is preferably water or its mixtures, and a liquid-inputting gas-removing pipe (not shown in the figure) is communicated with the containing chamber 46, and the working fluid 40 is filled into the containing chamber 46 which is formed by the upper metal casing 32 and the lower metal casing 34, and a liquid-inputting gas-removing pipe is provided for removing gas and sealed to form the vapor chamber and heat pipe combined structure of this preferred embodiment.

Figure 9:
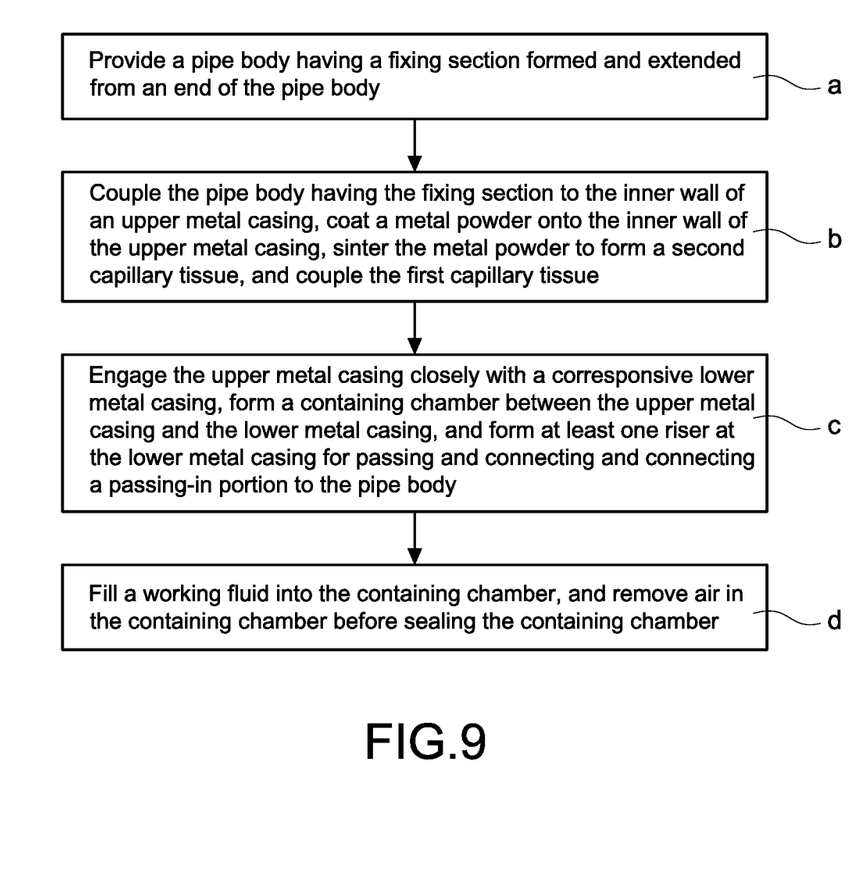
FIG. 9 is a flow chart (in form of a block diagram) of a vapor chamber and heat pipe combining method of this disclosure.

With reference to FIG. 9 for a block diagram (which is a flow chart) of a vapor chamber and heat pipe combining method of this disclosure, the vapor chamber and heat pipe combined structure is manufactured by this method, and the method comprises the following steps:

Step a): Provide a pipe body 12 having a fixing section 14 formed and extended from an end of the pipe body 12, and a first capillary tissue 16 disposed along the pipe body 12. The pipe body 10 is made of a thermally conductive material such as copper, aluminum, or their alloys, etc and further comprises a cut edge 22 cut from the pipe body 14, so that the fixing section 14 is in the shape of a flat plate, or both sides of an arc pipe portion 26 are coupled to form two flaps 24.

Step b): Connect the pipe body 14 having the fixing section 14 to an inner wall of an upper metal casing 32, and coat a metal powder (not shown in the figure) onto the inner wall of the upper metal casing 32, and sinter the metal powder to form a second capillary tissue 50 to be connected to the first capillary tissue 16. The fixing section 14 is preferably fixed to the inner wall of the upper metal casing 32 by spot welding or plasma welding. In addition, and the upper metal casing 32 is sintered together to form a second capillary tissue 50 after the metal powder is coated onto the inner wall of the lower metal casing 34.

Step c): Engage the upper metal casing 32 to a corresponsive lower metal casing 34, wherein a containing chamber 46 is formed between the upper metal casing 32 and the lower metal casing 34, and at least one riser 38 of the lower metal casing 34 has a passing-in portion 40 for passing and connecting the pipe body 14. In this step, the upper metal casing 34 and the lower metal casing 34 are made of a thermally conductive material such as copper, aluminum, or their alloys, etc, and the upper metal casing 32 and the lower metal casing 34 are stacked and engaged with one another, and the peripheries of the upper and lower metal casing 32, 34 are welded and sealed. A base plate 42 of the lower metal casing 34 is integrally formed and the base plate 42 has a plurality of support bodies 36 vertically extended therefrom and a metal powder is coated on a surface of each support body 36 and sintered to form a second capillary tissue 50.

Step d): Fill a working fluid 60 into the containing chamber 46, and removing air from the containing chamber 46 before sealing the containing chamber 46. In this step, the working fluid 60 is water or its mixture, and a liquid-inputting gas-removing pipe (not shown in the figure) is communicated with the containing chamber 46 and provided for filling the working fluid 60 into the containing chamber 46 formed by the upper metal casing 32 and the lower metal casing 34, and the liquid-inputting gas-removing pipe for removing gas is sealed to complete the vapor chamber and heat pipe combined structure of this preferred embodiment.

In Step a) of a preferred embodiment, the cut edge 22 is cut and formed by a knife or a cutter and then bent and spread into the fixing section 14. In another preferred embodiment, both sides of the arc pipe portion 26 are coupled to form each flap 24 to be connected to the inner wall of the upper metal casing 32, and the upper metal casing 32 has an arc groove (which is the attaching portion 322) welded and coupled to the corresponsive arc pipe portion 26.

In Step b), the second capillary tissue 50 is made of a material including but not limited to a metal mesh, a fiber bundle, or any other composite material. In addition, the connection of the second capillary tissue 50 and the first capillary tissue 16 further includes a third capillary tissue (not shown in the figure) for connecting the two. In other words, the first capillary tissue 16 formed in the pipe body 12 and the second capillary tissue 50 formed in the upper metal casing 32 are configured to be corresponsive to each other, and a metal powder is coated between the two and then sintered, so that a third capillary tissue for connecting the second capillary tissue 50 and the first capillary tissue 16 is formed. This preferred embodiment further comprises a plurality of fins 70 disposed at positions proximate to the closed end 18 of the pipe body 12 to improving the heat dissipation effect.

While this disclosure has been described by means of specific embodiments, numerous modifications and variations could be made thereto by those skilled in the art without departing from the scope and spirit of this disclosure set forth in the claims.

What is claimed is:

1. A vapor chamber and heat pipe combined structure, comprising:

a heat pipe, comprising a pipe body, a fixing section extended from an end of the pipe body, and a first capillary layer installed in the pipe body;

a vapor chamber, comprising an upper metal casing, a lower metal casing closely engaged with the respective upper metal casing, a containing chamber formed between the upper metal casing and the lower metal casing, a second capillary layer installed in the containing chamber, a wall disposed around the lower metal casing, and a pass through portion communicated with the containing chamber, wherein the heat pipe is passed and coupled to the pass through portion, and the fixing section is coupled to the upper metal casing, so that the first capillary layer and the second capillary layer are coupled to each other; and a working fluid, filled in to the containing chamber, wherein the pipe body further includes a concaved arc-shaped cut edge with an end section, the end section transitioning into the fixing section, wherein the fixing section is in the shape of a flat plate, and wherein a width of the fixing section is longer than a diameter of the pipe body.

2. The vapor chamber and heat pipe combined structure according to claim 1, wherein the pipe body has a closed end and an open end, and the fixing section is formed and extended from the open end to the outside of the pipe body, and the upper metal casing has an attaching portion disposed at a position opposite to the fixing section.

3. The vapor chamber and heat pipe combined structure according to claim 2, wherein the attaching portion is a planar surface.

4. The vapor chamber and heat pipe combined structure according to claim 1, wherein the first capillary layer is extended from the pipe body to the fixing section and coupled to the second capillary layer.

5. The vapor chamber and heat pipe combined structure according to claim 1, wherein the vapor chamber further comprises a plurality of support bodies, and each support body is installed between the upper metal casing and the lower metal casing.

6. The vapor chamber and heat pipe combined structure according to claim 5, wherein each support body is erected and extended from a base plate of the lower metal casing to the second capillary layer of the upper metal casing, and the second capillary layer is disposed on a surface of each support body.

7. The vapor chamber and heat pipe combined structure according to claim 1, further comprising a plurality of fins disposed at an end of the pipe body.

8. The vapor chamber and heat pipe combined structure according to claim 1, wherein the pass through portion is a through hole or a through slot.

9. The vapor chamber and heat pipe combined structure according to claim 1, further comprising a third capillary layer coupled to the first capillary layer and the second capillary layer.

* * * * *